(12) United States Patent
Mauder et al.

(10) Patent No.: US 9,843,181 B2
(45) Date of Patent: Dec. 12, 2017

(54) SEMICONDUCTOR DEVICE INCLUDING A CONTROL CIRCUIT

(71) Applicant: Infineon Technologies Austria AG, Villach (AT)

(72) Inventors: Anton Mauder, Kolbermoor (DE); Wolfgang Scholz, Olching (DE)

(73) Assignee: Infineon Technologies Austria AG, Villach (AT)

( * ) Notice: Subject to any disclaimer, the term of this patent is extended or adjusted under 35 U.S.C. 154(b) by 288 days.

(21) Appl. No.: 13/951,039

(22) Filed: Jul. 25, 2013

(65) Prior Publication Data

US 2015/0029627 A1   Jan. 29, 2015

(51) Int. Cl.
*H02H 7/00* (2006.01)
*H01L 29/739* (2006.01)
*H01L 29/06* (2006.01)
*H01L 29/40* (2006.01)

(52) U.S. Cl.
CPC ........... *H02H 7/00* (2013.01); *H01L 29/7397* (2013.01); *H01L 29/0649* (2013.01); *H01L 29/407* (2013.01); *H01L 2924/0002* (2013.01)

(58) Field of Classification Search
CPC ..... H02H 7/00; H01L 29/0649; H01L 29/407; H01L 29/7397; H01L 2924/0002
USPC ................... 361/93.9, 101, 87, 81
See application file for complete search history.

(56) References Cited

U.S. PATENT DOCUMENTS

| | | | | |
|---|---|---|---|---|
| 5,162,966 A * | 11/1992 | Fujihira | ............... | H01L 27/0251 257/140 |
| 5,289,028 A * | 2/1994 | Clark | ................... | H01L 27/0251 257/139 |
| 5,304,802 A * | 4/1994 | Kumagai | ............ | H01L 27/0251 257/133 |
| 5,396,117 A * | 3/1995 | Housen et al. | ................ | 327/480 |
| 5,874,768 A * | 2/1999 | Yamaguchi et al. | .......... | 257/493 |
| 6,194,764 B1 * | 2/2001 | Gossner | .............. | H01L 27/0248 257/355 |
| 6,229,197 B1 * | 5/2001 | Plumton | ........... | H01L 29/66318 257/198 |
| 6,538,480 B2 * | 3/2003 | Takada et al. | ................. | 327/108 |
| 2002/0039037 A1 | 4/2002 | Takada et al. | | |
| 2004/0070407 A1 * | 4/2004 | Fang et al. | ..................... | 324/662 |
| 2010/0287399 A1 * | 11/2010 | Yasuda | ..................... | G06F 1/28 713/340 |
| 2011/0133718 A1 * | 6/2011 | Watanabe et al. | ............ | 323/311 |

(Continued)

FOREIGN PATENT DOCUMENTS

EP            0176747 A1 *  4/1986

*Primary Examiner* — Thienvu Tran
*Assistant Examiner* — Kevin J Comber
(74) *Attorney, Agent, or Firm* — Murphy, Bilak & Homiller, PLLC

(57) ABSTRACT

A semiconductor device includes a semiconductor portion with a main FET and a control circuit. The main FET includes a gate electrode to control a current flow through a body zone between a source zone and a drift zone. The control circuit receives a local drift zone potential of the main FET cell and outputs an output signal indicating when the local drift zone potential exceeds a preset threshold. The control circuit may turn down or switch off the main FET and/or may output an overcurrent indication signal when the local drift zone potential exceeds the preset threshold.

24 Claims, 9 Drawing Sheets

(56) References Cited

U.S. PATENT DOCUMENTS

2013/0181723 A1* 7/2013 Mauder .............. G01R 19/0092
            324/601
2013/0249602 A1* 9/2013 Mauder et al. ............... 327/108

* cited by examiner

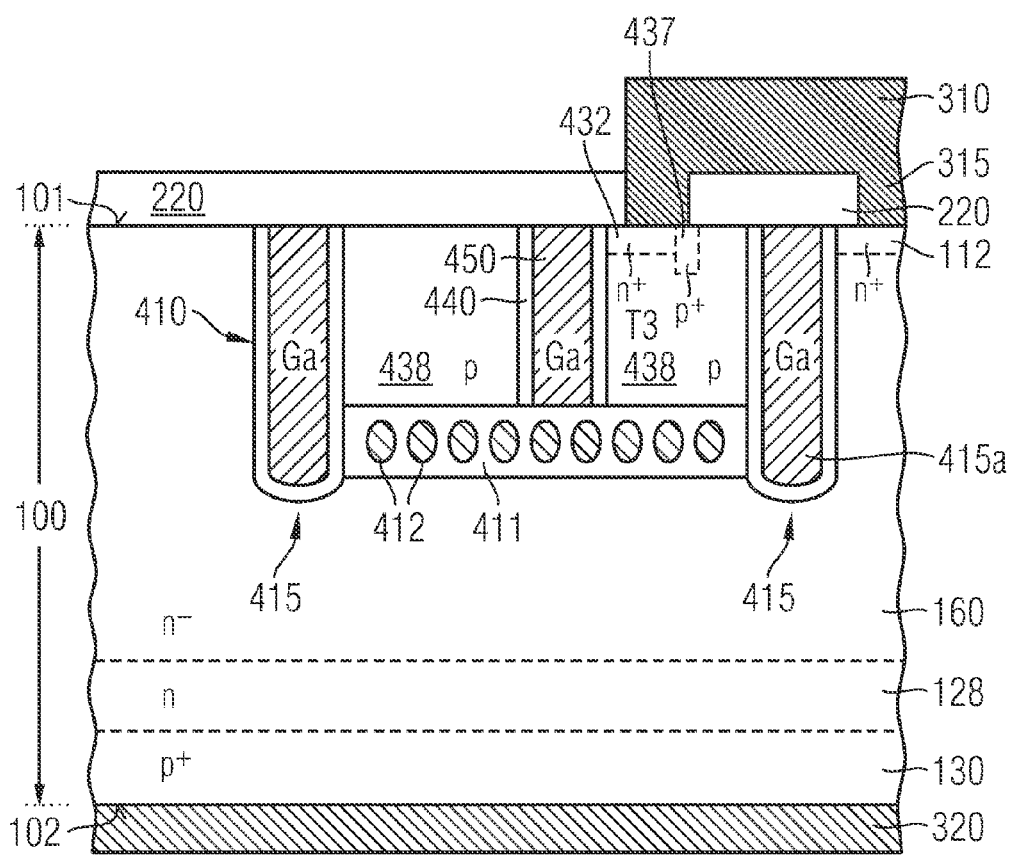

US 9,843,181 B2

1

SEMICONDUCTOR DEVICE INCLUDING A CONTROL CIRCUIT

BACKGROUND

Semiconductor devices, e.g. IGBTs (insulated gate bipolar transistors), are typically based on field effect transistor cells that provide a large channel width to keep a voltage drop across the channel low for ensuring low losses in the conductive state. On the other hand, a large total channel width increases the short-circuit current and adversely affects the short circuit ruggedness of the semiconductor device. A high short circuit ruggedness is required in some applications, e.g. the controlling of the speed of electrical motors with an IGBT-equipped inverter. During short circuit, the IGBT actively limits the current flowing through the IGBT thus nearly the full supply voltage drops across the load terminals of the IGBT. During short circuit operation, the power dissipated in the IGBT is extremely high due to a high voltage and a high current at the load terminals at the same time. This energy dissipated leads to a strong increase of the device temperature since it can be drained to a heatsink only in a small portion. It is desirable to provide semiconductor devices with high short circuit ruggedness.

SUMMARY

According to an embodiment a semiconductor device includes a semiconductor portion with a main FET (field effect transistor) and a control circuit. The main FET includes a gate electrode to control a current flow through a body zone between a source zone and a drift zone. The control circuit receives a local drift zone potential of the main FET cell and outputs an output signal indicating when the local drift zone potential exceeds a preset threshold.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

2

Figure 3A:
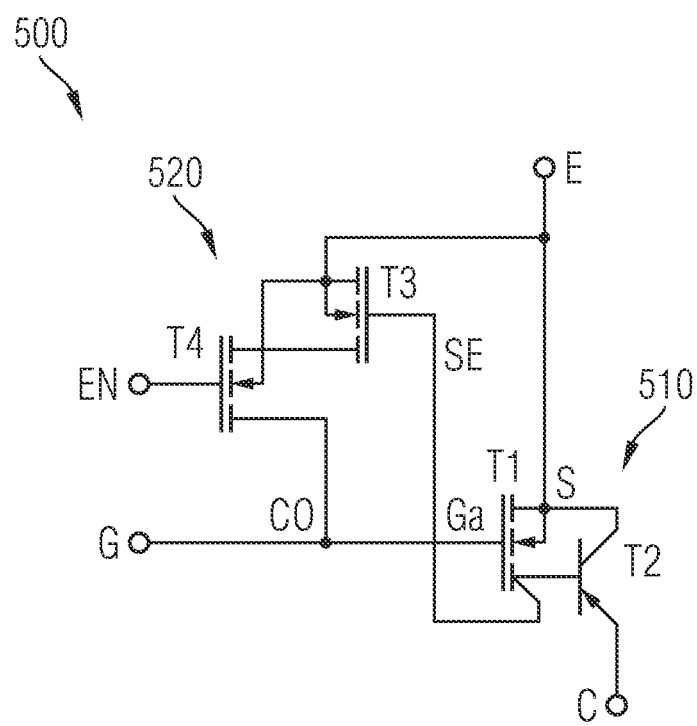
FIG. 3A is a schematic circuit diagram of an IBGT device in accordance with an embodiment providing a control circuit with an enable input.
Figure 3B:
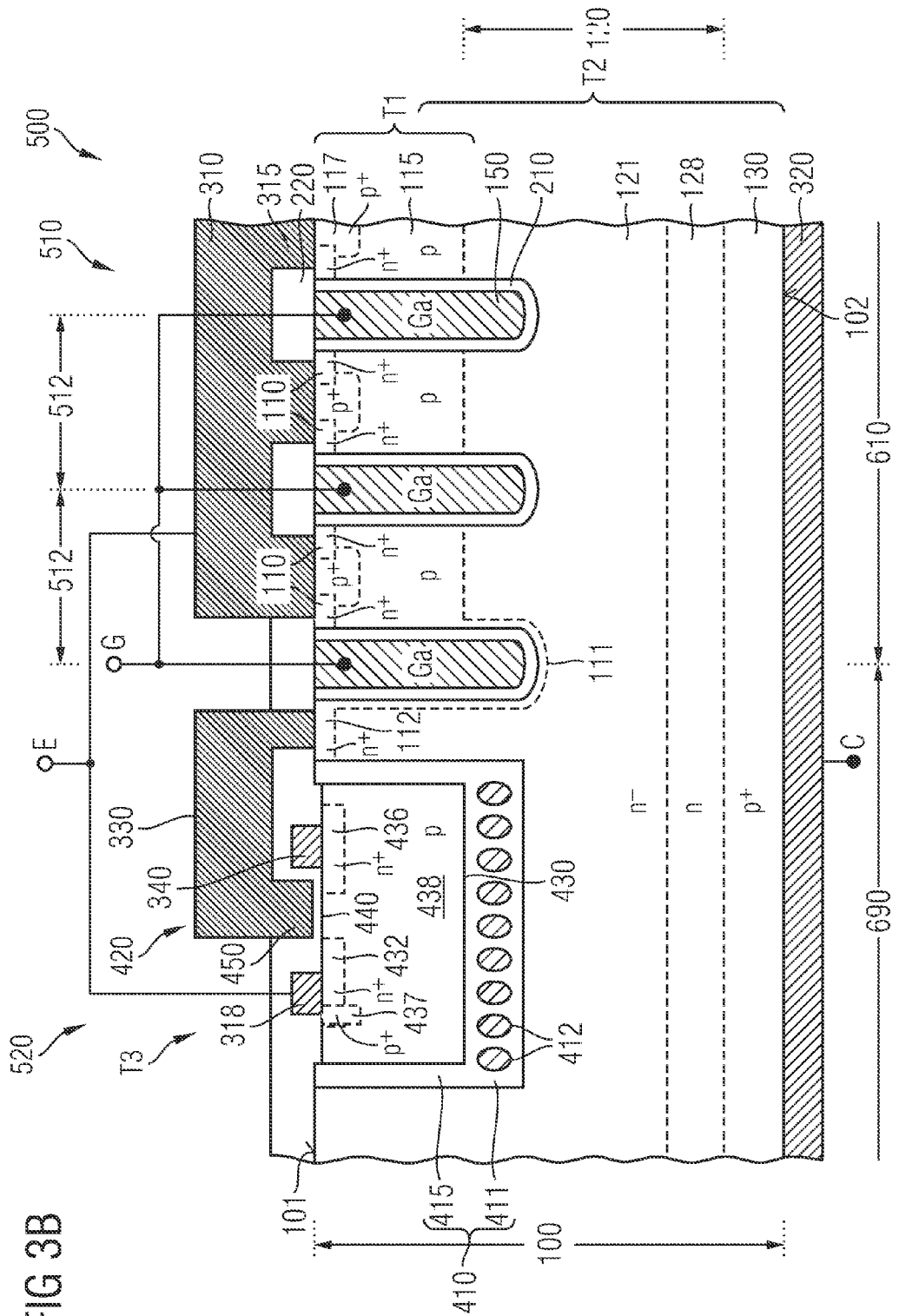
FIG. 3B is a schematic cross-sectional view of the IBGT device of FIG. 3A through a first auxiliary transistor of the control circuit.
Figure 3C:
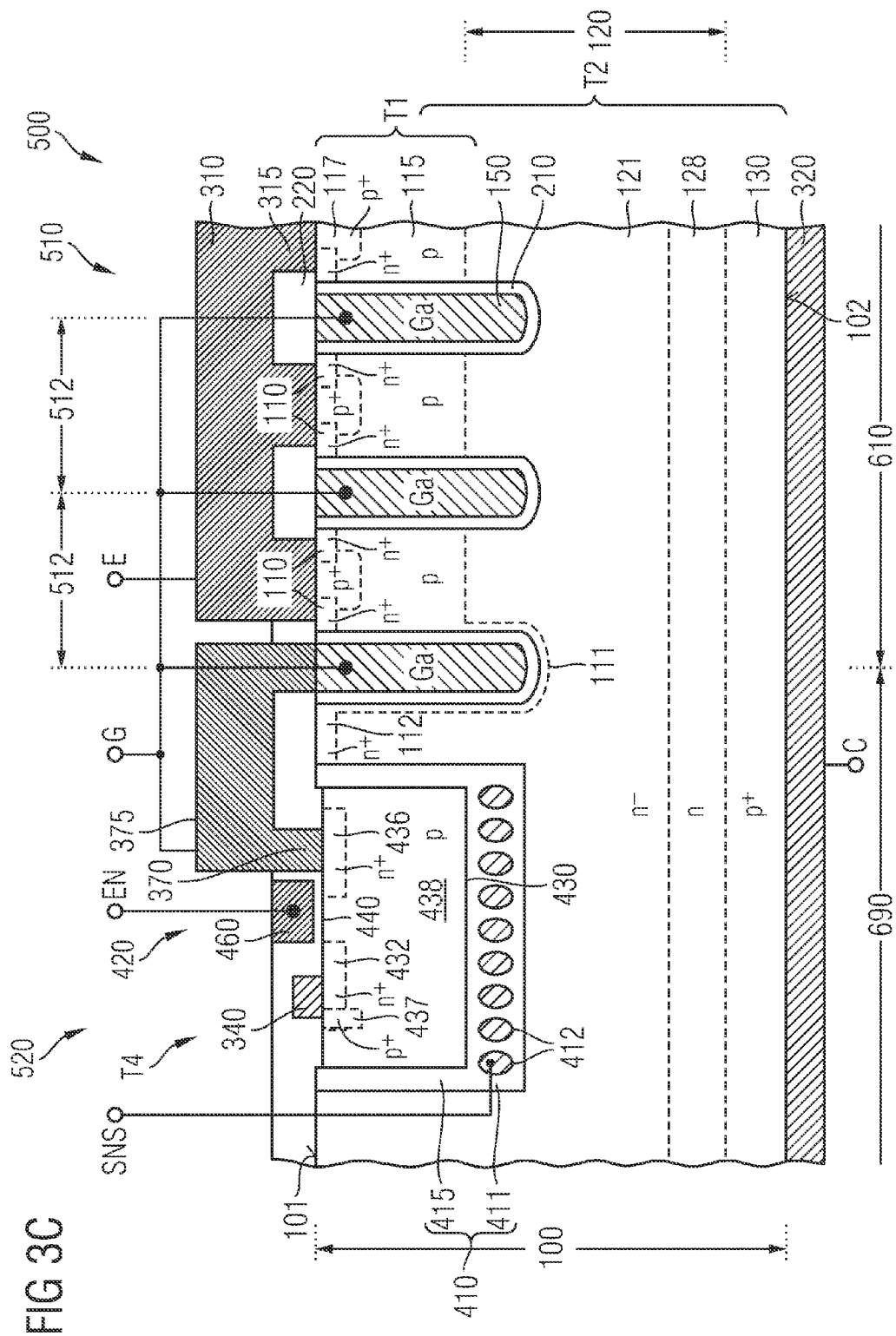
FIG. 3C is a schematic cross-sectional view of the IBGT device of FIG. 3A through a second auxiliary transistor of the control circuit.
Figure 3D:
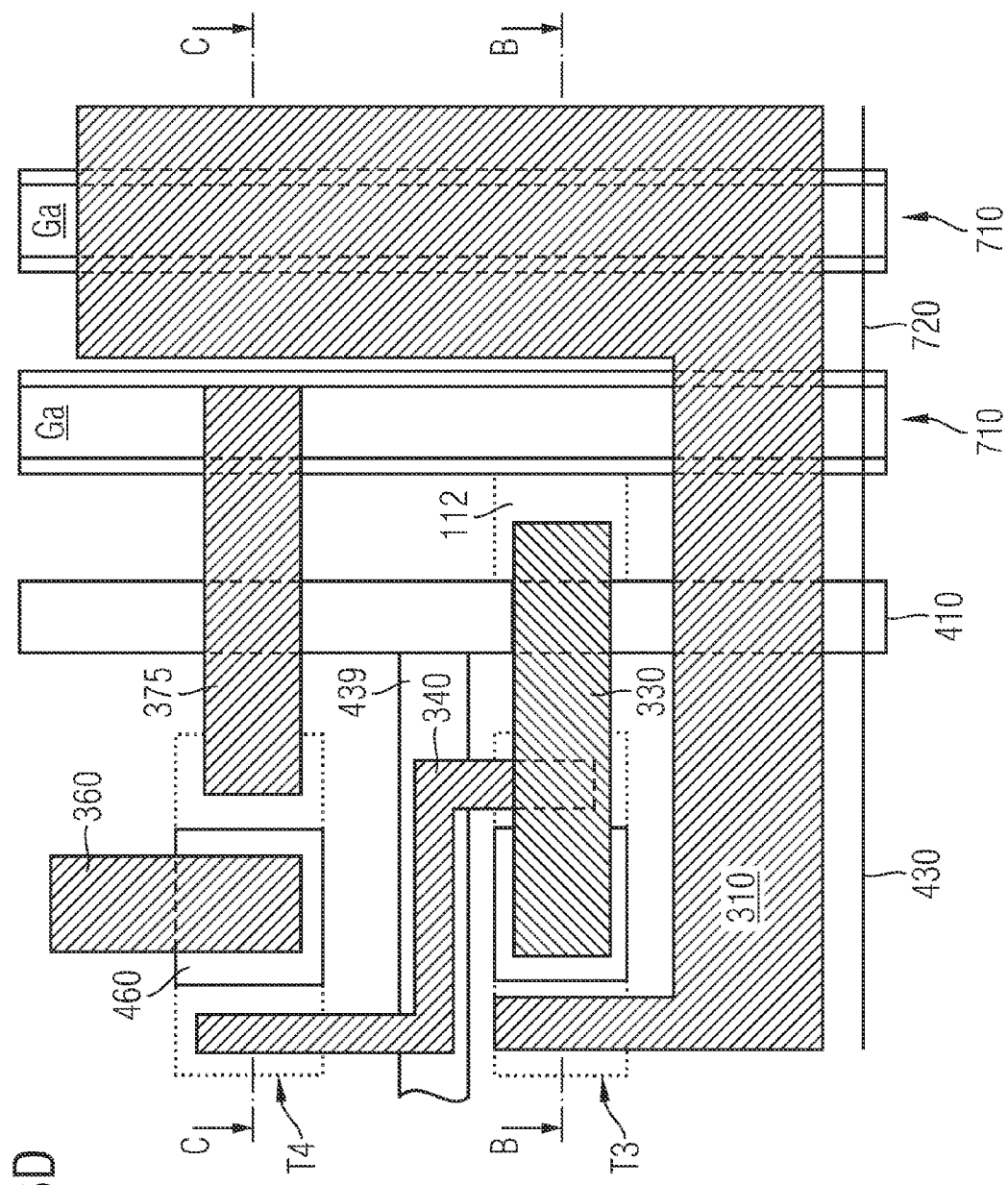

FIG. 3D is a schematic plan view of a portion of the IBGT device of FIG. 3A including the control circuit.

FIG. 4 is a cross-sectional view of a portion of an IGBT device in accordance with an embodiment providing a control circuit in an isolated semiconductor region with modified cell trench structures providing the lateral isolation.

Figure 5A:
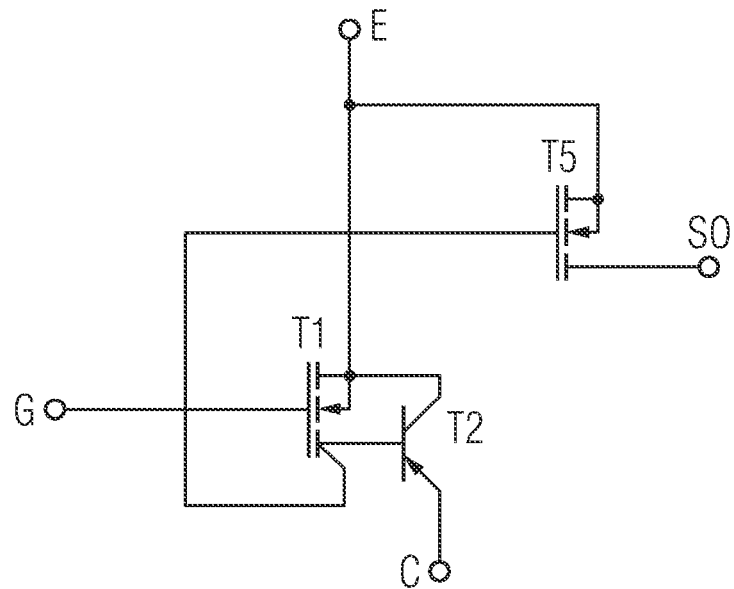

FIG. 5A is a schematic circuit diagram of an IBGT device according to an embodiment providing an overcurrent indicator signal.

Figure 5B:
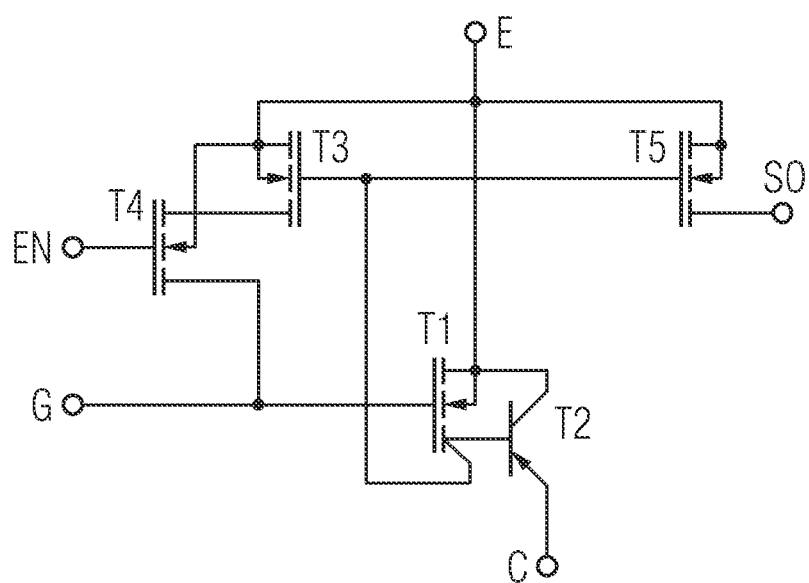

FIG. 5B is a schematic circuit diagram of an IBGT device in accordance with an embodiment providing an enable input and an overcurrent indicator signal output.

Figure 6:
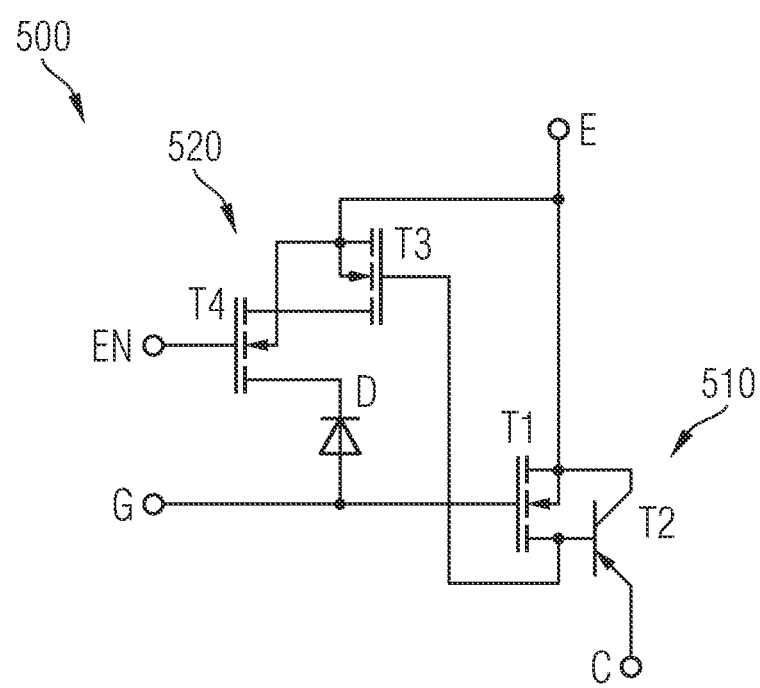

FIG. 6 is a schematic circuit diagram of an IBGT device in accordance with an embodiment providing a diode between the control circuit and the gate electrode of the main FET.

DETAILED DESCRIPTION

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
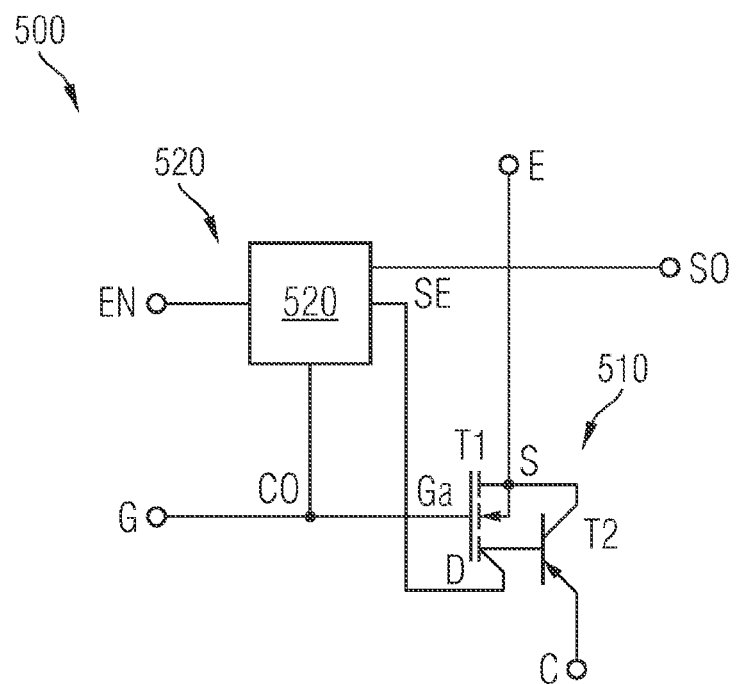
FIG. 1 is a schematic circuit diagram of an IBGT device with a control circuit in accordance with an embodiment.

FIG. 1 illustrates a semiconductor device 500 integrating a power switching device and a control circuit 520. The illustrated embodiments refer to power switching devices including IGBTs 510. The same considerations accordingly apply to IGFETs (insulated gate field effect transistors).

A circuit model of the IGBT 510 includes a main FET T1 and a main BJT (bipolar junction transistor) T2 arranged in a cascade connection. A drain current of the main FET T1, having source S that is electrically connected to an emitter terminal E and having gate Ga is electrically connected to a gate terminal G of the IGBT device 500, controls the base current of the main BJT T2. An emitter-collector path is provided between the emitter terminal E and a collector terminal C of the IGBT device 500. A signal applied to the gate electrode Ga of the main FET T1 controls via the current flow between source S and drain D of the main FET T1 the current flow through the main BJT T2.

The control circuit 520 may include a sense input SE receiving a sense signal, which represents a local drift zone potential of the main FET T1. The sense input SE is electrically connected with a sense section of a drift zone of the main FET T1 close to or directly adjoining an interface between the drift zone and a body zone. The interface may be defined or controlled by a pn junction between the body and drift zones.

At a control output CO, the control circuit 520 outputs an output signal indicating whether or not the local drift zone potential exceeds a preset threshold. The preset threshold may indicate an overcurrent condition. The control circuit 520 either limits a short circuit current or limits the period of time during which a short circuit occurs or limits both to improve the short circuit ruggedness of the semiconductor device 500. The output signal may partly or completely turn down the main FET T1.

According to an embodiment, the output signal may switch the main FET T1 off when the local drift zone potential sensed at the sense input SE exceeds the preset threshold. The control output CO of the control circuit 520 may be electrically coupled, e.g. electrically connected, to the gate electrode Ga of the main FET T1 and pulls the signal at the gate electrode Ga to a voltage below the threshold voltage of the main FET T1 such that the main FET T1 switches off irrespective of a signal level applied at the gate terminal G. A resistive element may be provided in the path between the gate terminal G and the network node shared by the control output CO and the gate electrode Ga.

According to another embodiment, the control output CO of the control circuit 520 is electrically coupled, e.g. electrically connected, to the gate electrode Ga of the main FET T1 and pulls the signal at the gate electrode Ga to a voltage between the threshold voltage of the main FET T1 and the voltage of the external gate drive connected to the terminal G such that the main FET T1 limits the base current of the bipolar transistor T2 and thus the overcurrent carried by the IGBT 510. A resistive element may be provided in the path between the gate terminal G and the network node shared by the control output CO and the gate electrode Ga.

The control circuit 520 may include an enable input EN for temporally enabling/disabling the control output CO. In addition or alternatively, the control circuit 520 may have a sense output SO for signaling the overcurrent condition of the IGBT device 500.

In the following, the mode of operation is described with reference to an n-IGBT with an n-FET as main FET T1 and a pnp BJT as main BJT T2. Similar considerations apply to a p-IGBT with a p-FET as the main FET T1 and an npn BJP as main BJT T2.

According to an embodiment, the local drift zone potential is the potential in a sense section of the drift zone close to the pn junction between the body and drift zones. In the conductive state, the local drift zone potential at the channel interface typically is below some 100 mV in the non-short-circuit or non-overcurrent conductive state, whereas under an overcurrent condition the local drain zone potential rises up to several Volts. The preset threshold voltage may be the threshold voltage of a field effect transistor at the sense input SE of the control circuit 520, by way of example. If the local drain zone voltage exceeds the preset threshold, the control circuit 520 may pull the signal at the gate electrode Ga to a voltage below the threshold voltage of the main FET such that the main FET T1 switches off irrespective of a signal externally applied to the gate terminal G. According to another embodiment, the signal at the gate electrode Ga may be pulled to a voltage between the threshold voltage of the main FET and the voltage supplied by an external gate control thus reducing the level of overcurrent and the power dissipation in the IGBT. This can extend the time until an external gate control senses the short circuit and turns off the IGBT.

The control circuit 520 is separated from the load and high voltage paths of the IGBT device 500 having further device parameters that remain unaffected by the control circuit 520. Apart from the overcurrent behavior, the IGBT device 500 provides the same static and dynamic characteristics as without control circuit 520, i.e. the static and dynamic characteristics of the IGBT 510, whereas other methods limiting the short circuit, e.g. by using forward biased diodes, significantly change the static and dynamic characteristics of the concerned IGBT.

Switching off the gate signal reduces the conductivity of the channel such that at a preset load current both the voltage drop over the channel and the local drain zone potential increase. The increase of the local drift zone potential accelerates and stabilizes the process of switching off the main FET T1. Hence the process of switching off the IGBT device 500 through the control circuit 520 is self-amplifying.

With the main NET T1 being switched off, the applied blocking voltage results in a potential well above the preset threshold voltage at the interface where the local drift zone potential is tapped. The short circuit protection mechanism thus inherently provides a hysteresis characteristic such that oscillations of the gate potential between the potential of the voltage forced by the control circuit 520 and the potential of the externally gate signal applied at the gate terminal G are reliably suppressed.

Figure 2A:
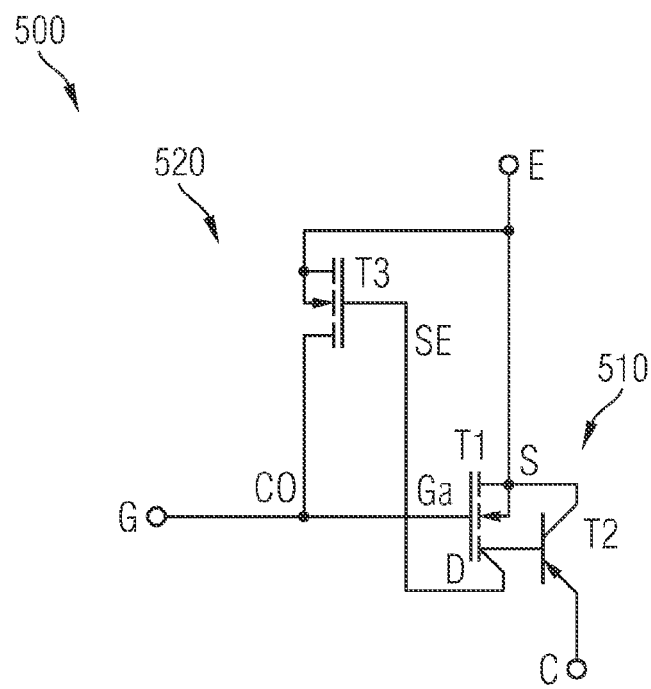
FIG. 2A is a schematic circuit diagram of an IBGT device with a control circuit in accordance with an embodiment providing an auxiliary FET between the emitter and gate terminals.

FIG. 2A depicts the control circuit 520 including a first auxiliary transistor T3 with the gate electrode receiving the local drift zone potential of the main FET T1. The threshold voltage of the first auxiliary transistor T3 corresponds to the preset threshold. If the local drift zone potential of the IGBT 510 exceeds the threshold voltage of the first auxiliary transistor T3, the first auxiliary transistor T3 supplies to the gate electrode Ga of the main FET T1 a potential below the threshold voltage of the main FET T1 irrespective of a signal externally applied to the gate terminal G of the IGBT device 500.

According to an embodiment, the first auxiliary transistor T3 electrically connects the gate electrode Ga of the main FET T1 with the emitter terminal E of the IGBT device 500 when the local drift zone potential exceeds the preset threshold, and disconnects the gate electrode Ga from the emitter terminal E when the local drift zone potential falls below the preset threshold.

According to a further embodiment, a zener diode may be arranged in series with the first auxiliary transistor T3. The Zener diode bars the gate voltage from being lowered to 0V.

Figure 2B:
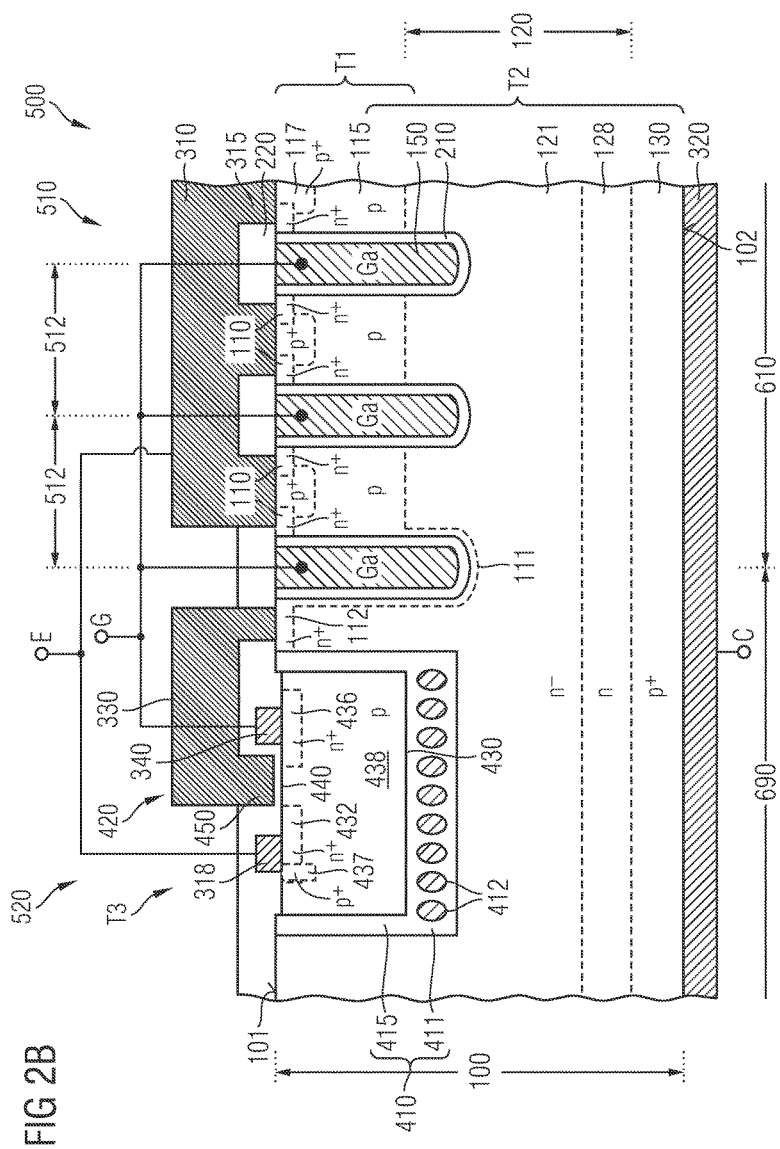
FIG. 2B is a cross-sectional view of a portion of the IGBT device of FIG. 2A.

FIG. 2B shows a portion of the IGBT device 500 with the IGBT 510 and the control circuit 520 integrated in the same semiconductor die. A semiconductor portion 100 of the semiconductor die is based on a single-crystalline semiconductor material, for example silicon Si, silicon carbide SiC, germanium Ge, a silicon germanium crystal SiGe, gallium nitride GaN or gallium arsenide GaAs. A distance between a first surface 101 of the semiconductor portion 100 and second surface 102, which is parallel to the first surface 101, may be at least 40 µm, for example at least 60 µm or at least 100 µm. The semiconductor portion 100 may have a rectangular shape with an edge length in the range of several millimeters. The normal to the first and second surfaces 101, 102 defines a vertical direction and directions orthogonal to the normal direction are lateral directions.

In an IGBT area 610 a plurality of parallel, vertical transistor cells 512 of a main FET T1 are arranged adjoining to or close to the first surface 101. In a conductive state of the main FET T1, vertical channels of the transistor cells 512 direct the on-state current in a vertical direction through body zones 115.

The transistor cells 512 form the main FET T1, and may be, for example, an MOSFET (metal oxide semiconductor field effect transistor) of the enhancement type, wherein the usual meaning of the term MOSFET includes both FETs with metal gate electrodes and FETs with non-metal electrodes. The transistor cells 512 include gate electrode structures 150 formed in cell trench structures extending from the first surface 101 into the semiconductor portion 100. The gate electrode structures 150 may be electrically connected with the gate terminal G of the IGBT device 500. Gate dielectrics 210 dielectrically insulate the gate electrode structures 150 from the surrounding semiconductor material of the semiconductor portion 100.

In semiconductor mesas between the cell trench structures, source zones 110 of a first conductivity type may directly adjoin the first surface 101. Body zones 115 of a second, complementary conductivity type extend between neighboring cell trench structures and separate the source zones 110 from a drift layer 120 of the first conductivity type, wherein a pn junction between the body zones 115 and the drift layer 120 is in substance parallel to the first and second surfaces 101, 102. Heavily doped contact zones 117 of the second conductivity type may extend between neighboring source zones 110 from the first surface 101 into body zones 115 and provide a low-ohmic connection of the body zones 115.

A collector layer 130 of the second conductivity type separates the drift layer 120 from the second surface 102. The drift layer 120 may include a low-doped drift zone 121 and a more heavily doped field stop zone 128. A mean net impurity concentration in the collector layer 130 may be at least $1 \times 10^{16}$ cm$^{-3}$, for example at least $5 \times 10^{17}$ cm$^{-3}$. The mean net impurity concentration in the field stop zone 128 or buffer layer may be between $1 \times 10^{15}$ cm$^{-3}$ and $5 \times 10^{16}$ cm$^{-3}$ or even up to $1 \times 10^{18}$ cm$^{-3}$ and may exceed at least five times the mean net impurity concentration in the drift zone 121. According to an embodiment, the field stop zone 128 may have an inhomogeneous doping in a vertical direction exhibiting one or more local maxima and/or one or more local minima. At the local maxima, the peak doping may excess the mean net impurity concentration in the field stop zone 128 up to a factor of 100 while the local minima may exhibit an impurity concentration down to the doping concentration of the drift zone 121 or even below. The mean net impurity concentration in the drift zone 121 may be between $5 \times 10^{12}$ cm$^{-3}$ and $5 \times 10^{14}$ cm$^{-3}$, by way of example.

A first electrode structure 310 is provided at the side of the first surface 101. Contact structures 315 extend through openings in a dielectric layer 220 covering the trench cell structures at least down to the first surface 101 and may electrically connect the first electrode structure 310 with the source zones 110 and the contact zones 117. According to other embodiments, the contact structures 315 fill contact grooves extending from a plane spanned by the first surface 101 into the semiconductor portion 100. The first electrode structure 310 may form or may be electrically connected or coupled to an emitter terminal E of the IGBT device 500.

A second electrode structure 320 directly adjoins the second surface 102 and is electrically connected to the collector layer 130. The second electrode structure 320 may form or may be electrically connected or coupled to a collector terminal C of the IGBT device 500.

In the following description, the first conductivity type is the n type and the second conductivity type is the p type. According to other embodiments, the first conductivity type may be the p type and the second conductivity type may be the n type.

The IGBT 510 may be modeled as an n type main FET T1 having a drain current that supplies the base current of a pnp main BJT T2, wherein the body zone 115 and the collector layer 130 are effective as emitter and collector regions and the drift layer 120 provides a base region of the main BJT T2.

The control circuit 520 may be formed in an isolated semiconductor region 430 in a circuit area 690 of the semiconductor portion 100. A dielectric shield structure 410 dielectrically insulates the isolated semiconductor region 430, which comprises semiconductor elements of the control circuit 520, at least in a vertical direction from the surrounding semiconductor material of the semiconductor portion 100 with the drift zone 121. The dielectric shield structure 410 bars charge carriers flooding the drift layer 120 from adversely affecting the functionality of the semiconductor elements of the control circuit 520.

According to an embodiment, the dielectric shield structure 410 includes a buried portion 411 separating the isolated semiconductor region 430 from the drift layer 120 in the vertical direction. The dielectric shield structure 410 may consist of or contain a semiconductor oxide layer, for example a silicon oxide layer and may include tubes 412 filled with a gaseous material such as oxygen, nitrogen, a noble gas or a mixture of these gases or containing a vacuum. According to an embodiment, the tubes 412 may be alternatively or additionally at least partially filled with conductive material.

According to the illustrated embodiment, the dielectric shield structure 410 further includes vertical portions 415 and forms a closed frame extending from the first surface 101 into the semiconductor portion 100, wherein the closed frame completely surrounds the isolated semiconductor region 430.

The isolated semiconductor portion 430 may have a main portion 438 of the second conductivity type, wherein wells of the first conductivity type extend from the first surface 101 into the main portion 438 and form source and drain zones 432, 436 of one or more auxiliary transistors or cathode zones of diodes electrically arranged between the IGBT 510 and the control circuit 520.

The semiconductor elements forming the control circuit 520 may include one or more field effect transistors of a planar or vertical design. According to the illustrated embodiment, the control circuit 520 includes a first auxiliary transistor T3. The first auxiliary transistor T3 may be a transistor with a vertical or a lateral channel. According to the illustrated embodiment, the first auxiliary transistor T3 is a planar transistor with a gate structure 450 provided outside the semiconductor portion 100. A gate dielectric 440 dielectrically insulates the gate structure 450 from a body zone formed by a section of the main portion 438 between the source and drain zones 432, 436. A source electrode 318 directly adjoins the source zone 432 and a heavily doped contact zone 437 of the second conductivity type extending from the first surface 101 into the main portion 438. The source zone 432 may be electrically connected with the first electrode structure 310 and the emitter terminal E. A drain electrode 340 directly adjoins the drain zone 436 and may be electrically connected with the gate electrode structures 150 of the IGBT 510 and the gate terminal G. A sense connection structure 330 may be electrically connected with both the gate structure 450 and a heavily doped sense contact zone 112 of the first conductivity type.

Each of the first and second electrode structures 310, 320, the source and drain electrodes 318, 340 of the first auxiliary transistor T3 and the sense connection structure 330 may consist of or contain, as main constituent(s) aluminum Al, copper Cu, or alloys of aluminum or copper, for example AlSi, AlCu or AlSiCu. According to other embodiments, one, more or all of the first and second electrode structures 310, 320, the source and drain electrodes 318, 340 and the sense connection structure 330 may contain one or more layers with nickel Ni, titanium Ti, silver Ag, gold Au, platinum Pt, tungsten W, cobalt Co and/or palladium Pd as main constituent(s). For example, at least one of the cited structures 310, 320, 318, 340, 330 includes two or more sub-layers, at least one of the sub-layers containing one or more of Ni, Ti, Ag, Au, Pt, W, Co and Pd as main constituent (s), e.g., a silicide, a nitride and/or an alloy.

The sense contact zone 112 may be a one-part structure or may include several spatially separated portions. According to an embodiment, the sense contact zone 112 consists of or includes a portion directly adjoining an outermost one of cell trench structures arranged in a cell array. Further portions of the sense contact zone 112 may directly adjoin another cell trench structure of the cell array. The sense connection structure 330 directly adjoins and provides an ohmic contact with all portions of the sense contact zone 112.

Between the pn junction formed between the body zone 115 and the drift zone 121 of the outermost transistor cell 512 and the sense contact zone 112 a contiguous path exists in semiconductor material of the first conductivity type along the outermost cell trench structure.

In the conductive state of the IGBT 510, a positive voltage applied to the gate electrode structures 150 induces an electron accumulation channel 111 along the contour of the outermost cell trench structure between the pn junction and the sense contact zone 112. The accumulation channel 111 taps the local drift zone potential close to the pn junction and at the end of an inversion channel in the body zone 115 of the outermost transistor cell 512 and supplies the local drift zone potential to the sense contact zone 112.

The sense contact zone 112 is shielded by the adjoining cell trench structure and/or by neighboring impurity zones of the second conductivity type. Since the sense contact zone 112 is only connected to the gate structure 450 of the high-impedance auxiliary FET T3, the tapping of the local drift zone potential does not induce a current flow in the accumulation channel 111.

In addition to the first auxiliary transistor T3 of FIGS. 2A and 2B, the control circuit of FIG. 3A includes a second auxiliary transistor T4 providing an enable functionality.

The signal at the gate electrode Ga of the main FET T1 becomes inactive irrespective of a signal applied at the gate terminal G only when both the local drift zone potential indicates an overcurrent condition and an enable signal applied at the gate electrode of the second auxiliary transistor T4 is active. The enable signal may be generated by a driver circuit integrated in the semiconductor portion 100 or may be externally applied through an enable terminal EN of the IGBT device 500.

The first and second auxiliary transistors T3, T4 may be arranged in series between the emitter terminal E and the gate electrode Ga of the main FET T1. By controlling adequately the enable signal the overcurrent protection mechanism may be temporally or permanently disabled or enabled. For example, a control unit supplying the enable signal may control the enable signal such that the overcurrent protection is disabled during switching periods during which the IGBT 510 is switched on or off. For example, the overcurrent protection mechanism may be activated some 10 ns, some 100 ns or some microseconds, at least less than 5 microseconds after the signal at the gate terminal G changes from inactive to active and remains activated until the gate terminal G changes back to inactive. According to another embodiment, the control circuit 520 may be disabled some 100 ns or some microseconds, at least less than 5 microseconds before the signal at the gate terminal G changes from active to inactive.

FIGS. 3B to 3D show cross-sectional views of the IGBT device 500 of FIG. 3A according to an embodiment providing the first and second auxiliary transistors T3, T4 as lateral transistors in an isolated semiconductor region 430.

FIG. 3B widely corresponds to the cross-sectional view of FIG. 2B. Other than in the previous embodiment, the drain electrode 340 of the first auxiliary transistor T3 is not electrically connected with the gate electrode structures 150 but is also effective as the source electrode of the second auxiliary transistor T4 as shown in FIG. 3D.

The second auxiliary transistor T4 shown in FIG. 3C may be arranged in the same isolated semiconductor region 430 as the first auxiliary transistor T3 and may be oriented parallel to the first auxiliary transistor T3. A further electric connection 375 may electrically connect a drain electrode 370 of the second auxiliary transistor T4 with the gate electrode structures 150 of the IGBT 510. A gate electrode 360 of the second auxiliary transistor T4 may form or may be electrically connected or coupled to an enable terminal EN of the IGBT device 500 or an output of a driver circuit integrated in the semiconductor portion 100.

As shown in FIG. 3D, a shallow trench insulation 439 may separate the first and second auxiliary transistors T3, T4. Other embodiments may provide a pn separation of the first and second auxiliary transistors T3, T4 using p-type sections of the main portion 438.

Referring back to FIG. 3B, the dielectric shield structure 410 may comprise a buried portion 411 including tubes 412 filled with a gaseous material such as, oxygen, nitrogen, a noble gas or a mixture of these gases or may contain a vacuum. According to an embodiment, the tubes 412 may be alternatively or additionally at least partially filled with conductive material. The tubes 412 are extending in a direction perpendicular to the cross-sectional plane and parallel to the cell trench structures.

According to an embodiment, the buried portion 411 of the dielectric shield structure 410 may be provided by introducing, from the first surface 101, auxiliary trenches into the semiconductor portion 100 in an auxiliary trench field. The auxiliary trenches may be narrower and shallower than trenches for providing the cell trench structures. A wider circumferential trench may surround the auxiliary trench field. A thin thermal oxide may be grown and patterned by a lithographic process, such that the patterned thermal oxide exposes the auxiliary trench field and covers the area outside the auxiliary trench field. The auxiliary trench field is exposed to a heating process in a hydrogen ambient wherein in the area exposed by the patterned thermal oxide the semiconductor material liquefies and forms joint ridges arching over lower portions of the auxiliary trenches converted to tubes 412. Outside the auxiliary trench field, the thin sacrificial oxide bars the semiconductor material from fluidifying. End portions of the tubes 412 may be exposed by a further auxiliary trench that may laterally enclose the ridges. A further oxidation process may oxidize the ridges such that the tubes 412 are separated by oxide.

Since the process of liquefying can be performed in an epitaxy reactor the process may be integrated with growing by epitaxy the isolated semiconductor region 438. During the latter process the gate trenches for the cell trench structures may be filled with e.g. conductive polycrystalline semiconductor material, which also may cover the inner surface of the tubes 412 via the surrounding further auxiliary trench. The conductive material may be connected with the source or emitter connection E and thus shield the semiconductor material in the well from voltage fluctuations caused by the collector potential at the second surface 102 of the semiconductor portion 100.

During turning-on and turning-off the main IGBT the voltage change at the collector potential leads to a capacitive coupling to the conductive structures in the tubes 412. According to another embodiment, at least a part of the conductive structures in the tubes 412 embedded in the buried portion 411 may be connected to a sense terminal SNS as shown in FIG. 3C or to a sense transistor and is used to detect the voltage fluctuations at the collector terminal.

The resulting dielectric shield structure 410 dielectrically insulates an isolated semiconductor region provided within the frame-like dielectric shield structure 410 in the vertical and lateral directions.

The tubes 412 not completely filled with a solid dielectric but containing a gas, a vacuum and/or a conductor allow to control the thermomechanical stress caused by the buried portion 411 and thus allow thicker buried portions 411. Thicker buried portions 411 reduce capacitive coupling between the voltage fluctuations at the collector terminal and the isolated semiconductor region 430. Thicker buried portions 411 further allow higher voltage differences between the isolated semiconductor region 430 and the adjacent part of the drift zone 160.

According to the embodiment illustrated in FIG. 4, the vertical portions 415 of the dielectric shield structure 410 are modified cell trench structures. The modified cell trench structures may include a fill structure 415*a* of a conductive material, for example heavily doped polycrystalline silicon. A dielectric liner corresponding to the gate dielectric 210 of FIG. 2B dielectrically separates the fill structure 415*a* from the material of the semiconductor portion 100 and the isolated semiconductor region 430. The fill structure 415*a* may be electrically connected with the emitter terminal E. The main portion 438 of the isolated semiconductor region 430 may be doped in the same process as the body zones 115 of the IGBT 510. The auxiliary transistors of the control circuit 520 may be lateral transistors with trench gates.

FIG. 4 shows the trench gate 450 for the first auxiliary transistor T3 having a drain zone that is arranged in a direction perpendicular to the cross-section. For example the gate electrode 450 of the first auxiliary transistor T3 is located in a trench reaching from the first surface 101 of the semiconductor material to the buried portion 411 and dielectrically insulated from the main portion 438 in the isolated semiconductor region 430 by a dielectric which may act as gate dielectric 440. According to an embodiment, the source and drain connections of the first auxiliary transistor T3 may be located on both sides of the gate trench 450 to increase channel width and current capability of the first auxiliary transistor T3. The second auxiliary transistor T4 may be realized in the same way and is not shown in FIG. 4 for more clarity.

According to an embodiment, the body zones 115 of both the first and second auxiliary transistors T3, T4 are electrically connected with the emitter terminal E such that in the case of a n-IGBT the main portion 438 in the isolated semiconductor region 430 has the most negative potential in the IGBT device 500 and can be used for a pn isolation of semiconductor elements of the control circuit, e.g. the first and second auxiliary transistors T3, T4 of FIGS. 3A to 3D. According to an embodiment, the gate control voltage of the IGBT at the gate terminal G may be set to a negative voltage during off-state. In this case, the main portion 438 in the isolated semiconductor region 430 has to be set to the negative supply voltage of the gate control to fulfill the requirement of the most negative potential in the IGBT device 500.

The IGBT device 500 illustrated in FIG. 5A provides a third auxiliary transistor T5 for signalizing an overcurrent condition. The third auxiliary transistor T5 widely corresponds to the first auxiliary transistor T3 of FIG. 2A. Other than the first auxiliary transistor T3 of FIG. 2A, the drain of the third auxiliary transistor T5 is not electrically connected to the gate electrode Ga of the main FET T1 but to a sense output terminal SO or to an input of a circuit integrated in the IGBT device 500. The embodiment support applications subject to high safety and security standards, for example in the field of automotive, that require feedback information signalizing a switching state or a fail state of a switching device.

The feedback feature may be combined with any of the above-described embodiments. FIG. 5B combines the feedback feature with the self-sustaining shutdown feature implemented by the first auxiliary transistor T3 and the enable feature for the self-sustained shutdown realized by the second auxiliary transistor T4.

FIG. 6 integrates a diode D between the gate terminal G and the control output of the control circuit 520, e.g. the drain of the second auxiliary transistor T4, for allowing the self-sustained shutdown for externally applied gate voltages which are more negative than the potential applied at the emitter terminal E.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor device comprising:
   a main FET comprising a gate electrode configured to control a current flow between a source zone and a drift zone through a body zone in a semiconductor portion, wherein the drift zone includes a sense section close to or directly adjoining an interface between the drift zone and the body zone, and further includes a remaining drift zone section extending from the sense section to an end of the drift zone, wherein the drift zone comprises the sense section and the remaining drift zone section, and the sense section and the remaining drift zone section have the conductivity type of the source zone; and a control circuit directly electrically connected to the sense section, the control circuit being configured to directly receive a local drift zone potential at the sense section located at a distance to the end of the drift zone and to output an output signal indicating when the local drift zone potential exceeds a preset threshold.

2. The semiconductor device according to claim 1, wherein
the control circuit is configured to reduce the current flow through the main FET or to switch the main FET off when the local drift zone potential exceeds the preset threshold.

3. The semiconductor device according to claim 1, comprising:
a low impedance sense connection structure electrically connecting a sense input of the control circuit with the sense section of the drift zone of the main FET.

4. The semiconductor device according to claim 3, wherein
the sense connection structure comprises at least one contiguous semiconductor path in a connection section of the semiconductor portion, the connection section having a conductivity type of the drift zone, the semiconductor path connecting the sense section of the drift zone with a respective heavily doped sense contact zone, the sense contact zone having a conductivity type of the drift zone and directly adjoining a first surface of the semiconductor portion, wherein the first surface is at a side of the semiconductor portion at which the source zones are formed.

5. The semiconductor device according to claim 4, wherein
the contiguous semiconductor path structurally connects the sense contact zone with an interface between the body and drift zones.

6. The semiconductor device according to claim 5, wherein
the semiconductor path is configured to join, in a conductive state, an inversion channel through the body zone.

7. The semiconductor device according to claim 5, wherein
the main FET includes a plurality of cell trench structures arranged in a cell array, wherein the cell trench structures comprise gate electrode structures and dielectric layers separating the gate electrode structures from the semiconductor portion and at least one of the cell trench structures directly adjoins the sense contact zone.

8. The semiconductor device according to claim 7, configured to form, in a conductive state, a charge carrier accumulation channel along the semiconductor path.

9. The semiconductor device according to claim 7, wherein
an outermost of the cell trench structures of the cell array directly adjoins the sense contact zone.

10. The semiconductor device according to claim 1, comprising:

a collector layer in a vertical direction of the source zone and directly adjoining a drift layer comprising the drift zone, the vertical direction given by a normal to a first surface of the semiconductor portion, the collector layer having a second conductivity type opposite to a first conductivity type of the drift zone, wherein the drift layer separates the body zone and the collector layer.

11. The semiconductor device according to claim 1, comprising
a dielectric shield structure dielectrically insulating an isolated semiconductor region that comprises semiconductor elements of the control circuit from a section of the semiconductor portion including the drift zone at least in a vertical direction with respect to a first surface of the semiconductor portion.

12. The semiconductor device according to claim 11, wherein
the dielectric shield structure forms a laterally closed frame extending from the first surface into the semiconductor portion and surrounding the isolated semiconductor region.

13. The semiconductor device according to claim 11, wherein
a buried portion of the dielectric shield structure separates the isolated semiconductor region from the section of the semiconductor portion including the drift zone in the vertical direction.

14. The semiconductor device according to claim 13, wherein
the buried portion of the dielectric shield structure contains conductive structures embedded in a dielectric and electrically connected to a sense terminal or a potential in the semiconductor device.

15. The semiconductor device according to claim 11, wherein
the isolated semiconductor region includes a main portion of the conductivity type of the body zones and wells of the conductivity type of the source zones, the wells extending from the first surface into the isolated semiconductor region.

16. The semiconductor device according to claim 1, wherein
the control circuit comprises a first auxiliary transistor that includes a gate electrode electrically connected with the sense section through a low impedance path.

17. The semiconductor device according to claim 16, wherein
the first auxiliary transistor is configured to connect/disconnect the gate electrode of the main FET with/from the source zone of the main FET in response to a signal applied to a gate structure of the first auxiliary transistor.

18. The semiconductor device according to claim 1, wherein
the control circuit is configured to be enabled/disabled in response to a signal applied to an enable input.

19. The semiconductor device according to claim 18, wherein
the control circuit comprises a first auxiliary transistor with a gate electrode electrically connected with the drain zone of the main FET and a second auxiliary transistor with a gate electrode electrically connected with the enable input, wherein the first and second auxiliary transistors are configured to connect/disconnect the gate electrode of the main FET with/from the source zone of the main FET in response to signals applied to the gate electrodes of the first and second auxiliary transistors.

20. The semiconductor device according to claim 1, comprising:
a diode electrically arranged between the control circuit and the gate electrode of the main FET.

21. The semiconductor device according to claim 1, comprising:
a low impedance connection structure electrically connecting a sense input of the control circuit with the sense section of the drift zone of the main FET, wherein
the connection structure comprises a continuous semiconductor path in the semiconductor portion.

22. The semiconductor device according to claim 21, wherein
the continuous semiconductor path is formed in a region of the semiconductor portion of a conductivity type of the drift zone.

23. The semiconductor device according to claim 21, wherein
the semiconductor path connects the sense section of the drift zone with a heavily doped sense contact zone of a conductivity type of the drift zone.

24. The semiconductor device according to claim 1, comprising:
a collector layer separated from the source zone by a drift layer that comprises the drift zone, wherein the collector layer forms a pn junction with the drift layer.

\* \* \* \* \*